US009054646B2

(12) United States Patent
Nicollini et al.

(10) Patent No.: US 9,054,646 B2
(45) Date of Patent: Jun. 9, 2015

(54) INTEGRATED AMPLIFIER FOR DRIVING ACOUSTIC TRANSDUCERS

(75) Inventors: Germano Nicollini, Piacenza (IT); Federico Guanziroli, Monza e Brianza (IT); Massimo Orio, Monza e Brianza (IT); Carlo Pinna, Milan (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 304 days.

(21) Appl. No.: 13/808,604

(22) PCT Filed: Aug. 2, 2011

(86) PCT No.: PCT/EP2011/063263
§ 371 (c)(1),
(2), (4) Date: Feb. 14, 2013

(87) PCT Pub. No.: WO2012/019940
PCT Pub. Date: Feb. 16, 2012

(65) Prior Publication Data
US 2013/0208922 A1      Aug. 15, 2013

Related U.S. Application Data

(60) Provisional application No. 61/386,773, filed on Sep. 27, 2010.

(30) Foreign Application Priority Data

Aug. 10, 2010   (EP) .................................... 10172369

(51) Int. Cl.
*H03F 3/181*   (2006.01)
*H03F 1/30*   (2006.01)
(Continued)

(52) U.S. Cl.
CPC .................. *H03F 3/181* (2013.01); *H03F 1/30* (2013.01); *H03F 1/34* (2013.01); *H03F 3/187* (2013.01);
(Continued)

(58) Field of Classification Search
None
See application file for complete search history.

(56) References Cited

U.S. PATENT DOCUMENTS 5,789,974 A  *   8/1998   Ferguson et al. .................. 330/2
2008/0309404 A1 *  12/2008   Berkhout ........................ 330/84
(Continued)

FOREIGN PATENT DOCUMENTS

WO       2009/105696  A1      8/2009

OTHER PUBLICATIONS

International Search Report issued in corresponding International application No. PCT/EP2011/063263, mailing date Sep. 12, 2011.
(Continued)

*Primary Examiner* — Brenda Bernardi
(74) *Attorney, Agent, or Firm* — Patent Portfolio Builders PLLC

(57) ABSTRACT

The invention relates to an electronic integrated amplifier for driving an acoustic transducer. The amplifier comprises two differential input terminals to receive an input signal and a first and a second output terminal to provide an output signal to the transducer. In addition, the amplifier comprises an operational amplifier having an input end including differential inputs and an output end operatively associated with the first and second output terminals. A pair of input resistors connect the two differential input terminals to two intermediate terminals, respectively. A pair of feedback resistors connect the first and second output terminals to the two intermediate terminals, respectively. The integrated amplifier also comprises means for high-pass filtering the input signal. Such filtering means is characterized in that it comprises an input element interposed between said intermediate terminals and the input end of the operational amplifier, and a feedback element connected between the input end and the output end of the same operational amplifier.

12 Claims, 2 Drawing Sheets

(51) Int. Cl.
  *H03F 1/34* (2006.01)
  *H03F 3/187* (2006.01)
  *H03F 3/213* (2006.01)
  *H03F 3/45* (2006.01)
  *H03H 19/00* (2006.01)

(52) U.S. Cl.
  CPC ............ *H03F 3/213* (2013.01); *H03F 3/45475* (2013.01); *H03F 3/45968* (2013.01); *H03F 3/45973* (2013.01); *H03F 2200/03* (2013.01); *H03F 2200/156* (2013.01); *H03F 2200/271* (2013.01); *H03F 2203/45136* (2013.01); *H03F 2203/45156* (2013.01); *H03F 2203/45212* (2013.01); *H03F 2203/45512* (2013.01); *H03F 2203/45514* (2013.01); *H03F 2203/45534* (2013.01); *H03F 2203/45544* (2013.01); *H03H 19/004* (2013.01)

(56) References Cited

U.S. PATENT DOCUMENTS

2009/0212855 A1* 8/2009 Mitchell .................. 327/552
2011/0158435 A1* 6/2011 Ono et al. ................ 381/120

OTHER PUBLICATIONS

Losmandy, B.J., "Operational Amplifier Applications for Audio Systems," Journal of the Audio Engineering Society, Audio Engineering Society, New York, NY, vol. 17, No. 1, Jan. 1, 1969, pp. 14-21, XP009102774, ISSN: 1549-4950.

Written Opinion of the International Searching Authority issued in corresponding International application No. PCT/EP2011/063263, mailing date Sep. 12, 2011.

* cited by examiner

US 9,054,646 B2

INTEGRATED AMPLIFIER FOR DRIVING ACOUSTIC TRANSDUCERS

TECHNICAL FIELD

The present invention relates to electronic integrated amplifying devices, particularly the invention relates to an integrated amplifier for driving acoustic transducers.

BACKGROUND ART

Digital audio player chains known in the art usually comprise digital interpolation filters followed by Digital-to-Analog Converters (DAC) and programmable gain amplifiers (PGA) that drive acoustic transducers. For example, a MP3 player includes two audio chains (left and right) that drive the left and right headphone transducers, respectively. Multimedia cellular phones include at least one additional chain to drive an earpiece for phone conversation. In the case more analog processing is desired or there is a need to connect extra transducers (for example, high power loudspeakers) a mixer and/or a multiplexer block can be included into the chain before the PGA drivers.

As known, in portable devices, e.g. MP3 players, cellular phones, PDAs (Personal Digital Assistant), portable computers, it is of utmost importance to reduce the power consumption of each block of the audio chain in order to increase as much as possible the listening (playback) time before a battery charging is required. Several solutions have been implemented to decrease the current consumption of the DAC and the driver amplifiers under the mA range without impacting their performances. However, one of the aspects that is not usually addressed is the current dissipation due to offset voltages that are present in the chain.

In fact, the offset voltage at the output of an audio chain, i.e. at earpiece driver output, can be high, for example, 10 mV because it comes from both the DAC and the PGA driver. Moreover, such offset can be amplified if the PGA gain is greater than 1. Assuming that the load impedance of the earpiece is typically 8 Ohm, the current consumption is 10 mV/8 Ohm=1.25 mA, that is comparable or even higher than the whole current consumption of the driver amplifier plus the DAC itself. Thus, a way to reduce the offset voltage generated in the whole audio chain is mandatory for future portable devices.

There are a few existing solutions used to reduce the offset generated in the audio chain.

A first known solution is based on trimming the offset voltage at silicon wafer level. Such trimming can be performed by using laser, fuses, Few Times Programmable (FTP) or One Time Programmable (OTP) circuits. It consists in measuring the offset at the output of the driver amplifiers by a testing machine, and then storing an offset, equal and opposite to the one to be cancelled, somewhere in the chain path. Unfortunately, such methodology requires extra process steps and extra testing time, i.e. extra manufacturing costs. Moreover, this solution reduces the offset voltage close to zero, only for a fixed gain of PGA drivers (the gain used during the wafer trimming), while it becomes ineffective when the manufacturer of the mobile phones and MP3 players change the PGA gain.

A second known solution is based on auto-calibration of circuits at power-up of the devices that include the audio player chain. Particularly, the offset voltage is cancelled by an extra on-chip circuit that is able to measure and calibrate the offset voltage according to a predefined algorithm. This solution is effective for any PGA selected gain if a power-up sequence is allowed before the gain selection. However, if a user changes the PGA gain during audio listening, it is not possible to start a power up sequence, thus even this solution become ineffective.

A third known solution is a circuit structure 300 shown in FIG. 3. In more detail, a high-pass filter, formed by capacitors C and resistors R1, is inserted at the input of the PGA driver amplifier 3 to remove the offset voltage of the DAC and to avoid the amplification of the offset of the driver itself, thus obtaining offsets lower than 1 mV at the driver output. This circuit structure has been widely used for video or voice applications. However, it can only be implemented with discrete circuit components and so it cannot be used for audio applications (audio bandwidth is from 20 Hz to 20 kHz). In fact, because the input impedance of the driver amplifier, i.e. the input resistance R1, is usually in the range of a few tens of $k\Omega$, in order to obtain a suitable cut-off frequency of about 10 Hz, the value of the capacitor C should be of some hundreds of nF. It is known that such high capacitance values are too big to be integrated.

A reference to the above circuit in FIG. 3 can be found in the book "Elettronica Analogica" by Franco Zappa, page 94, FIG. 3.17, particularly, in relation to a single ended solution.

SUMMARY OF THE INVENTION

An object of the present invention is to provide an electronic integrated amplifier, particularly for driving acoustic transducers, which overcomes at least some of the drawbacks and limitations of the known solutions related to the reduction of offset voltages in audio player chains.

An integrated amplifier according to the invention is described in claim 1.

Alternative embodiments of the amplifier are indicated in the dependent claims.

A further embodiment of the invention is a digital audio player chain comprising an integrated amplifier as indicated in claim 12.

BRIEF DESCRIPTION OF THE DRAWINGS

The characteristics and the advantages of the present electronic integrated amplifier will be better understood from the following detailed description of one embodiment thereof, which is given by way of illustrative and non-limiting example with reference to the annexed drawings, in which.

DETAILED DESCRIPTION OF PREFERRED EMBODIMENTS

A circuit diagram of a first embodiment of an electronic amplifier 100 of the invention for driving an acoustic transducer can be described with reference to FIG. 1. It should be noted that such first electronic amplifier 100 can be integrated on a chip of semiconductor material. In addition, the first electronic amplifier 100 has a single-ended output configured to drive, for example, one of the transducers of a headphone (not shown in FIG. 1).

A circuit diagram of a second embodiment of an electronic amplifier 200 of the invention which is integrated on a chip of semiconductor material can be described with reference to FIG. 2. Such second electronic amplifier 200 has a fully differential output configured to drive, for example, the transducer of an earpiece (not shown in FIG. 2).

Both integrated electronic amplifiers also called drivers 100 and 200 can be used in digital audio player chains. One or more audio player chains are included, for example, in portable devices, such as MP3 players, cellular phones, PDAs (Personal Digital Assistant), notebook, netbook, etc. Among other electronic components, each audio player chain usually comprises a digital interpolation filter followed by a Digital-to-Analog Converter (DAC) which is connected to the driver 100 or 200. If more analog processing is desired or if there is a need to connect extra transducers (for example, high power loudspeakers) the audio player chains can also include a mixer and/or a multiplexer block connected between the DAC and the drivers 100, 200.

Figure 1:
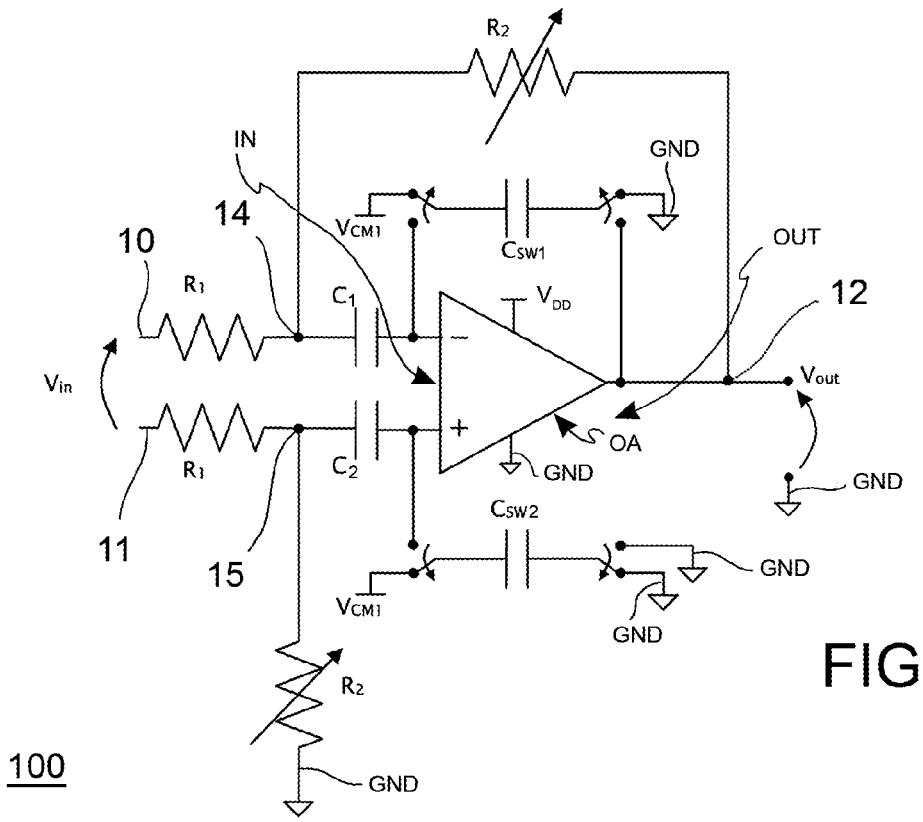
FIG. 1 shows a circuit diagram of a first embodiment of an integrated amplifier in accordance with the invention configured to drive a left (or right) headphone transducer.

With reference to FIG. 1, the first driver 100 comprises a first 10 and a second 11 differential input terminal to receive an input analog signal Vin to be amplified. The first driver 100 also comprises a first output terminal 12 to provide an output signal Vout to the transducer. Such output signal Vout is referred to a ground potential GND which also functions as the second output terminal for the first driver 100 in the present embodiment of the invention.

The first driver 100 also includes a first operational amplifier OA having an input end IN and an output end OUT. The input end IN comprises differential inputs, particularly a first inverting input "−" and a second non-inverting input "+".

The output end is operatively associated with the first 12 and second GND output terminals of the driver 100. In more detail, the first operational amplifier OA has a single-ended output connected to the first output terminal 12 in order to provide the output signal Vout referred to the ground potential, i.e. the second output terminal GND for the first driver 100.

Moreover, the first driver 100 includes a pair of input resistors R1 for connecting the first 10 and second differential input terminals to a first 14 and a second 15 intermediate terminal, respectively.

The first driver 100 further comprises a pair of feedback resistors R2 for connecting the first 12 and second GND output terminals to the first 14 and the second 15 intermediate terminals, respectively.

Figure 2:
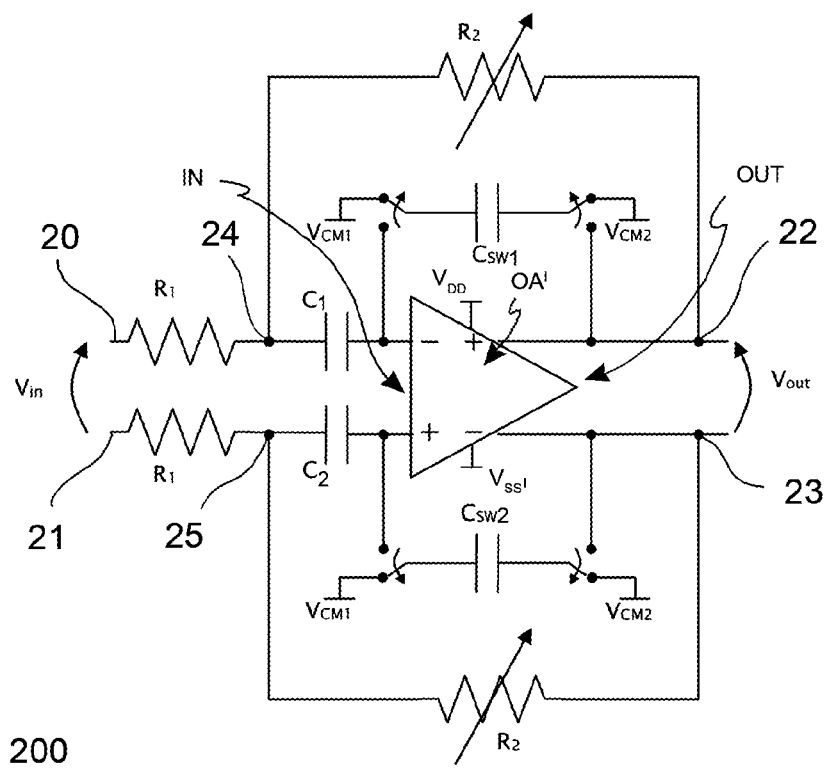
FIG. 2 shows a circuit diagram of a second embodiment of an integrated amplifier of the invention configured to drive an earpiece.
Figure 3:
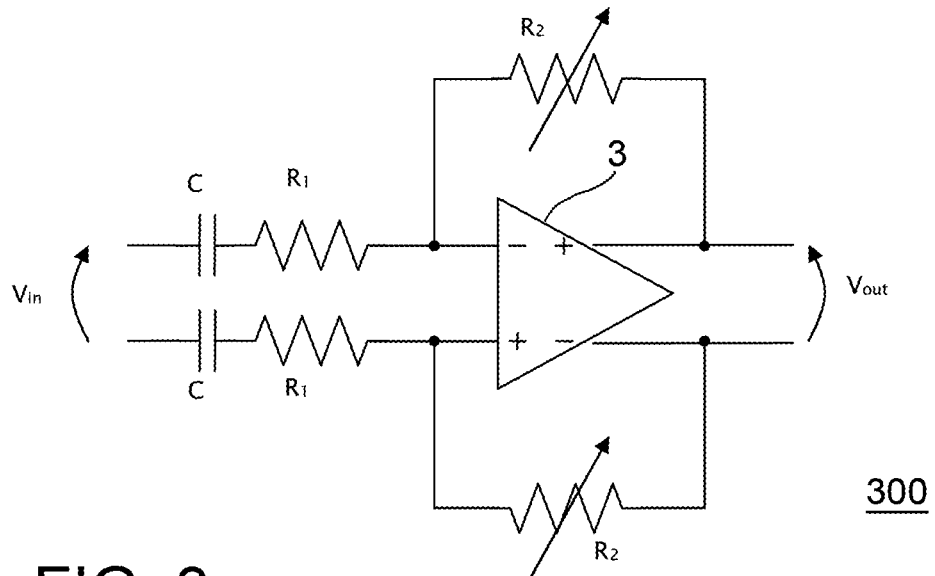
FIG. 3 shows a known circuit having discrete components and including a filter at the input of the PGA driver amplifier to remove the offset voltage of the DAC.

With reference to FIG. 2, the second driver 200 comprises a first 20 and a second 21 differential input terminal to receive the input signal Vin. The second driver 200 also comprises differential output terminals, i.e. a first 22 and a second 23 output terminal to provide the output signal Vout to the transducer.

The second driver 200 includes a second operational amplifier OA' having differential inputs analogous to those of the first amplifier OA at a respective input end IN. Such second operational amplifier OA' comprises differential outputs operatively associated with the first 22 and second 23 output terminal at a respective output end OUT. The differential outputs correspond to the first 22 and second 23 output terminals.

Moreover, the second driver 200 includes respective input resistors R1 for connecting the first 20 and the second 21 differential input terminals to a first 24 and a second 25 intermediate terminal, respectively.

In addition, the second driver 200 comprises respective feedback resistors R2 for connecting the first 22 and the second 23 output terminals to the first 24 and second 25 intermediate terminals, respectively.

The feedback resistors R2 of both the first 100 and the second 200 drivers are preferably variable resistors. In this way, both drivers 100, 200 have a gain that can be programmed as will be clarified below.

It should be noted that the above mentioned first OA and second OA' operational amplifiers comprise polarization terminals connected to a positive power supply potential $V_{DD}$ and to the ground potential GND (for OA) or to a negative power supply potential $V_{SS}$ (for OA').

Advantageously, the first 100 driver (the second 200 driver) comprises means $C_1$, $C_2$, $Csw_1$, $Csw_2$ for filtering the input signal Vin. Particularly, such filtering means comprises an input element $C_1$, $C_2$ interposed between the intermediate terminals 14,15 (24,25) and the input end IN of the first operational amplifier OA (second operational amplifier OA'). The filtering means also comprises a feedback element $Csw_1$, $Csw_2$ connected between the input end IN and the output end OUT of the first (second) operational amplifier OA (OA') via switching elements.

In more detail, with reference to FIG. 1, the input element of the filtering means comprises:

a first input capacitor $C_1$ connected between the first intermediate terminal 14 and the first differential input "−" of the first operational amplifier OA; and a second input capacitor $C_2$ connected between the second intermediate terminal 15 and the second differential input "+" of the first operational amplifier OA.

Analogously, with reference to the second driver 200 of FIG. 2, the input element of the filtering means comprises:

a first input capacitor $C_1$ connected between the first intermediate terminal 24 and the first differential input "−" of the second operational amplifier OA'; and a second input capacitor $C_2$ connected between the second intermediate terminal 25 and the second differential input "+" of the second operational amplifier OA'.

The above mentioned first input capacitor $C_1$ and second input capacitor $C_2$ should have the same value, preferably comprised in the range 50 pF-200 pF.

In addition, with reference to FIG. 1 (FIG. 2) the feedback element of the filtering means comprises:

a first $Csw_1$ switched capacitor connected between the first "−" differential input of the first or second (OA OA') operational amplifier and the first (12 22) output terminal via switching elements;

a second $Csw_2$ switched capacitor connected between the second "+" differential input of the first or second operational amplifier (OA OA') and the second (GND 23) output terminal via switching elements.

It should be noted that the above mentioned first $Csw_1$ and second $Csw_2$ switched capacitors should have the same value, preferably comprised in the range 5 fF-50 fF.

As shown in FIGS. 1 and 2, two switching devices are provided at the ends of the first $Csw_1$ and second $Csw_2$ switched capacitors. Such switching devices are controlled by a clock signal S so that during a first half-period of the clock signal S the first $Csw_1$ and the second $Csw_2$ switched capacitors are both connected between a first and a second reference potential.

With reference to the embodiment of FIG. 2, during such first half-period, the first $Csw_1$ and the second $Csw_2$ switched capacitors are connected between a first potential $Vcm_1$ and a second potential $Vcm_2$ so that both switched capacitors are charged to a voltage $Vb=Vcm_2-Vcm_1$.

Referring to the embodiment of FIG. 1, during the first half-period of signal S, the first $Csw_1$ and the second $Csw_2$ switched capacitors are connected between the first potential $Vcm_1$ and the ground potential GND so that both switched capacitors are charged to a voltage $Vb=-Vcm_1$.

With reference to the second driver 200 of FIG. 2, during a second half-period of the clock signal S, the first switched capacitor $Csw_1$ is connected between the first differential input "−" of the second operational amplifier OA' and the first output terminal 22 of the driver 200; the second switched capacitor $Csw_2$ is respectively connected between the second differential input "+" of the amplifier OA' and the second output terminal 23. In other words, during such second half-period of the clock signal S the inputs and outputs of the second operational amplifier OA' are dc biased at potentials $Vcm_1$ and $Vcm_2$, respectively.

With reference to the first embodiment of FIG. 1, during the second half-period of the clock signal S, the first switched capacitor $Csw_1$ is connected between the first differential input "−" of the first operational amplifier OA and the first output terminal 12 of the driver 100; the second switched capacitor $Csw_2$ is connected between the second differential input "+" of the amplifier OA and the ground potential GND. In this way, the inputs of the first operational amplifier OA are dc biased at potential $Vcm_1$.

Figure 4:
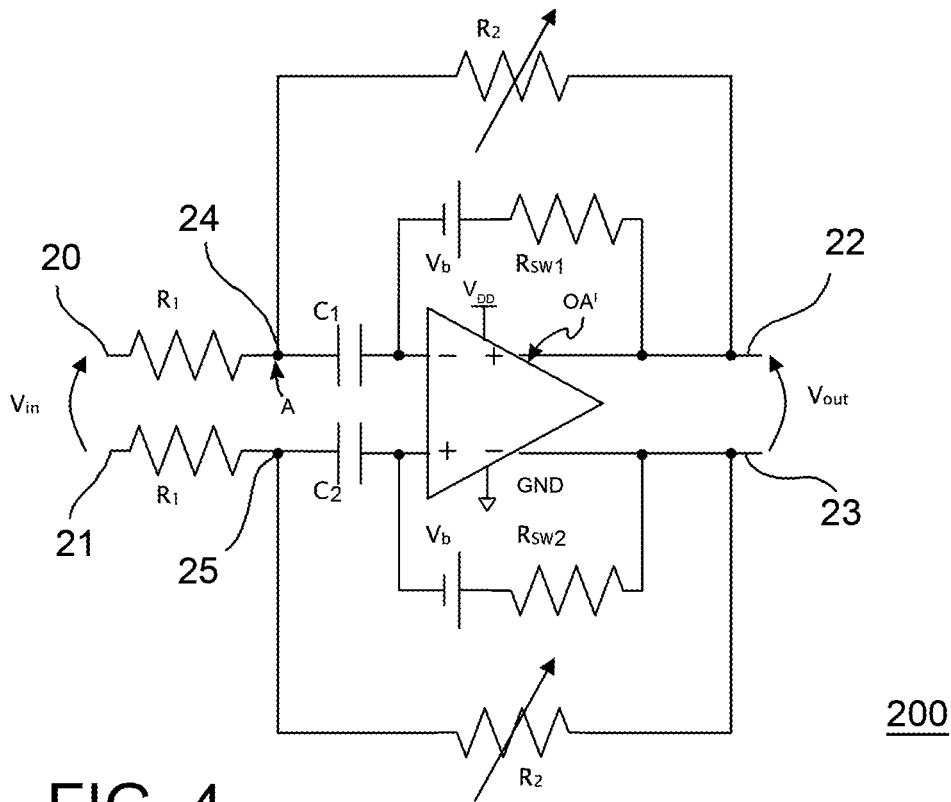
FIG. 4 shows a circuit diagram of an equivalent continuous time circuit of the integrated amplifier of FIG. 2.

The switched capacitor circuits described with reference to FIGS. 1 and 2 including both the first $Csw_1$ and second $Csw_2$ switched capacitors and their corresponding switching devices, are equivalent to a first $Rsw_1$ and a second $Rsw_2$ resistors, respectively, connected in series to a DC voltage generator Vb. For example, an equivalent continuous time circuit of the second driver 200 of FIG. 2 is schematically shown in FIG. 4.

The above-mentioned resistors have the same value $Rsw=Rsw_1=Rsw_2$ defined as:

$$Rsw = Rsw_1 = Rsw_2 = \frac{1}{f_s Csw} \quad (1)$$

where fs is the switching frequency of the clock signal S and Csw is the common value of the first $Csw_1$ and second $Csw_2$ switched capacitors.

It should be observed that the common value of the first $Rsw_1$ and second $Rsw_2$ resistors is typically in the range 100 MΩ-1 GΩ, and preferably about 400 MΩ. Therefore, such resistors $Rsw_1$, $Rsw_2$ are larger than the integrated feedback resistors R2 which typically have a value of about 10 kΩ.

Moreover, the switching frequency fs of the clock signal S is, for example, in the range 10 kHz-100 kHz.

Taking the above considerations into account, the behavior of the integrated amplifiers 100, 200 of the present invention is described below.

First of all, it is assumed that the input signal Vin applied to the inputs of the drivers 100, 200 is an analog signal comprising an additional constant voltage component, i.e. an offset voltage, usually generated by the DAC in the audio player chain.

The behavior of the second driver 200 is analyzed in detail below, but the same considerations and results are also valid for the first driver 100. For this purpose, reference can be made to the equivalent continuous time circuit of the second driver 200 as shown in FIG. 4.

When the overall input signal Vin received at the first 20 and second 21 differential input terminals of the second driver 200 has a very low frequency, i.e. the input signal Vin is substantially constant or varies very slowly, the first $C_1$ and the second $C_2$ input capacitors can be considered as essentially open circuits. In this way, the differential inputs of the second operational amplifier OA' are effectively disconnected from the first 24 and the second 25 intermediate inputs, respectively, i.e. the input signal Vin is disconnected from the operational amplifier OA' itself.

In this first condition, the inverting "−" differential input and the non-inverting "+" differential input of the second operational amplifier OA' are connected to the first 22 and to the second 23 output terminals, respectively, through the large resistors $Rsw_1$, $Rsw_2$ for biasing purposes. In such a case, assuming that no offset is introduced by the second operational amplifier OA', the output signal Vout is substantially null.

Therefore, any offset voltage included in the input signal Vin is rejected and will not be transferred to the transducer. In addition, any amplification of the offset voltage generated within the second driver 200 itself is avoided.

In fact, since the offset voltage generated within the driver 200 is a dc signal, the first $C_1$ and the second $C_2$ input capacitors, in the presence of such dc signal, are open circuits as their impedance becomes infinite. Thus, the second operational amplifier OA' becomes a unity gain buffer having the first $Csw_1$ and second $Csw_2$ switched capacitors as feedback only. As is known, for a unity gain buffer the offset generated within the second operational amplifier itself is seen at the output with a unitary gain, i.e. avoiding any amplification.

When the input signal Vin comprises a component with a frequency in the audio range (other than the offset), assuming that the audio bandwidth is from 20 Hz to 20 kHz, the first $C_1$ and the second $C_2$ input capacitors can be considered as short-circuits which allow the first 24 and the second 25 intermediate inputs to be connected to the differential inputs of the second operational amplifier OA'. Therefore, the audio frequency component of the input signal Vin is transferred to the inputs of the second operational amplifier OA' to be amplified.

In this second condition, the first $Rsw_1$ and the second $Rsw_2$ large resistors are each essentially connected in parallel to a feedback resistor R2. For such parallel connection, the feedback resistors R2 have a value that dominates over the corresponding values of the resistors Rsw.

In other words, for an input signal in the audio frequencies, the feedback switched capacitor circuits of $Csw_1$ and $Csw_2$ provide a contribution that is negligible with respect to the one provided by the feedback resistors R2. In this way, the second driver 200 assumes the classical configuration of an inverting amplifier well known by those skilled in the art.

Particularly, the amplified output signal Vout is an amplified replica of the input signal in the audio frequencies and the amplifier gain is $G=-R2/R1$. As indicated above, such gain G can be programmed by varying, for example, the value of the feedback resistor R2.

It should be observed that the filtering means $C_1$, $C_2$, $Csw_1$, $Csw_2$ comprised in the second driver 200 are configured to act as a high-pass filter for the input signal Vin. Particularly, the above described behavior of the second driver 200 for audio frequencies can be obtained if the input signal Vin has a frequency higher than a cut-off frequency fc associated with the high-pass filtering means $C_1$, $C_2$, $Csw_1$, $Csw_2$ of the invention. In audio circuits, the cut-off frequency fc typically has a value of about 10 Hz or less.

The cut-off frequency fc of the driver 100 or 200 can be calculated, for example, starting from FIG. 4. The corresponding calculation is reported in the annexed Appendix. Particularly, the cut-off frequency fc can be expressed by the following equation:

$$f_C = \frac{1-G}{2\pi} \frac{1}{R_{sw}C} = \frac{1-G}{2\pi} \frac{C_{sw}}{C} f_S \qquad (2)$$

where $G=-(R2/R1)<0$ is the gain of the driver 200 (or 100), C is the common value of the first $C_1$ and second $C_2$ input capacitors, Csw is the value of said first $Csw_1$ and second $Csw_2$ switched capacitors, fs is the switching frequency of the clock signal S.

If the ratio between Csw and C is, for example, in the range 0.001-0.0001, and fs is in the tens of kHz range, the cut-off frequency fc can be in the range of 1 Hz-10 Hz depending on the value of the gain G, thus assuring that no perturbation is introduced on the input audio signal Vin by the added branches comprising the input capacitors $C_1$, $C_2$ and the switched capacitors $Csw_1$, $Csw_2$.

An advantage provided by the integrated amplifiers 100, 200 of the invention is that they allow the removal of the offset voltage added to an input audio signal Vin. In fact, only input audio signals Vin having their frequencies higher than the cut-off frequency fc are amplified and provided to the audio transducers.

In addition, the amplifiers 100, 200 should avoid amplifying any offset generated within them. The amplifiers 100, 200 may be fully integrated (and so manufacturing costs may be reduced) even if the cut-off frequency associated with the high-pass filtering means is, for example, 10 Hz.

Finally, the offset voltage filtering solution proposed with the inventive amplifiers 100, 200 should not fail for some application conditions as happened for the solutions of the prior art, but should always be effective.

APPENDIX

With reference to FIG. 4, assuming Vb negligible, indicating with A one of the intermediate terminals 24 or 25, C=C1=C2, Csw1=Csw2=Csw, Rsw1=Rsw2=Rsw the currents at node A are evaluated to obtain the input-output transfer function:

$$\frac{V_{OUT} - V_A}{R_2} + \frac{V_{in} - V_A}{R_1} = V_A \cdot sC \Rightarrow$$

$$\frac{V_{in}}{R_1} = -\frac{V_{OUT}}{R_2} + V_A \cdot \left(\frac{1}{R_2} + \frac{1}{R_1} + sC\right)$$

where sC is the conductance of capacitor C1 in the Laplace domain.
With reference to Rsw $$V_{OUT} = -sC \cdot R_{SW} \cdot V_A \Rightarrow$$

$$V_A = -\frac{V_{OUT}}{sCR_{SW}}$$

Arranging the above results in a system:

$$\frac{V_{in}}{R_1} = -V_{OUT} \cdot \left(\frac{1}{R_2} + \frac{1}{R_2 \cdot sCR_{SW}} + \frac{1}{R_1 \cdot sCR_{SW}} + \frac{sC}{sC \cdot R_{SW}}\right)$$

-continued $$\frac{V_{in}}{R_1} = -\frac{V_{OUT}}{R_2} \cdot \left[1 + \frac{1}{sCR_{SW}} \cdot \left(1 + \frac{R_2}{R_1}\right) + \frac{R_2}{R_{SW}}\right]$$

$$\frac{V_{OUT}}{V_{in}} = -\frac{R_2}{R_1} \cdot \frac{1}{1 + \frac{1}{sCR_{SW}} \cdot \left(1 + \frac{R_2}{R_1}\right) + \frac{R_2}{R_{SW}}}$$

Assuming $R_{sw} \gg R_2$ $$\frac{V_{OUT}}{V_{in}} = -\frac{R_2}{R_1} \cdot \frac{sCR_{SW}}{sCR_{SW} + \left(1 + \frac{R_2}{R_1}\right)}$$

From the expression above, the gain for high frequencies is:

$$G = -\frac{R_2}{R_1}$$

The cut-off frequency of the high-pass filter is:

$$f_C = \frac{1}{2\pi \cdot R_{SW}C} \cdot \left(1 + \frac{R_2}{R_1}\right)$$

The invention claimed is:
1. Electronic integrated amplifier for driving an acoustic transducer, comprising:
   a first and a second differential input terminal to receive an input signal and a first and a second output terminal to provide an output signal to the transducer;
   an operational amplifier having an input end including a first and a second differential input and an output end operatively associated with said first and second output terminals;
   a pair of input resistors connecting said first and second differential input terminals to a first and a second intermediate terminal, respectively;
   a pair of feedback resistors connecting said first and second output terminals to the first and the second intermediate terminals, respectively; and
   means for high-pass filtering the input signal, characterized in that said means comprises an input element interposed between said intermediate terminals and the input end of the operational amplifier, and a feedback element connected between the input end and the output end of the operational amplifier.
2. Electronic integrated amplifier according to claim 1, wherein said input element of the filtering means comprises a first input capacitor connected between the first intermediate terminal and the first differential input of the operational amplifier, and a second input capacitor connected between the second intermediate terminal and the second differential input of the operational amplifier.
3. Electronic integrated amplifier according to claim 1, wherein said feedback element of the filtering means comprises a first and a second switched capacitor connected between the first and second differential inputs of the operational amplifier and the first and second output terminals via switching elements.
4. Electronic integrated amplifier according to claim 3, wherein said switching elements comprise switching devices provided at both ends of said first and second switched capacitors.

5. Electronic integrated amplifier according to claim 4, wherein said switching devices are controlled by a clock signal so that:

during a first half-period of the clock signal the first and the second switched capacitors are both connected between a first and a second reference potential; and during a second half-period of the clock signal the first switched capacitor is connected between said first differential input of the operational amplifier and said first output terminal, and the second switched capacitor is connected between said second differential input and said second output terminal.

6. Electronic integrated amplifier according to claim 1, wherein the output end of the operational amplifier comprises a single-ended output connected to the first output terminal.

7. Electronic integrated amplifier according to claim 1, wherein the output end of the operational amplifier comprises differential outputs connected to said first and second output terminals.

8. Electronic integrated amplifier according to claim 1, wherein if a substantially constant input signal is received at the first and second differential input terminals, the first and second intermediate terminals are effectively disconnected from the input end of the operational amplifier so that the output signal provided to the transducer is substantially null.

9. Electronic integrated amplifier according to claim 1, wherein if the input signal has a frequency higher than a cut-off frequency associated with said high-pass filtering means, the integrated amplifier is effectively a classical inverting amplifier having a gain G=−(R2/R1).

10. Electronic integrated amplifier according to claim 9, wherein said cut-off frequency is:

$$f_C = \frac{1-G}{2\pi} \frac{C_{sw}}{C} f_S$$

where G=−(R2/R1) is the gain of the amplifier, C is the value of said first and second input capacitors, Csw is the value of said first and second switched capacitors, and fs is a switching frequency of said clock signal.

11. Electronic integrated amplifier according to claim 9, wherein said feedback resistors are variable resistors.

12. A digital audio player chain comprising:

a digital interpolation filter;

a Digital-to-Analog Converter; and an electronic integrated amplifier for driving an acoustic transducer in accordance with claim 1.

\* \* \* \* \*